United States Patent
Pahl et al.

(10) Patent No.: US 10,448,530 B2
(45) Date of Patent: Oct. 15, 2019

(54) HOUSING USED FOR ELECTRIC COMPONENT AND METHOD FOR MANUFACTURING SAME

(71) Applicant: RF360 Technology (Wuxi) Co., Ltd., Wuxi (CN)

(72) Inventors: Wolfgang Pahl, München (DE); Thomas Telgmann, München (DE); Feng Zhang, Wuxi (CN)

(73) Assignee: RF360 Technology (Wuxi) Co., Ltd., Wuxi (CN)

( * ) Notice: Subject to any disclaimer, the term of this patent is extended or adjusted under 35 U.S.C. 154(b) by 0 days.

(21) Appl. No.: 16/063,269

(22) PCT Filed: Dec. 12, 2016

(86) PCT No.: PCT/CN2016/109474
§ 371 (c)(1),
(2) Date: Jun. 16, 2018

(87) PCT Pub. No.: WO2017/101745
PCT Pub. Date: Jun. 22, 2017

(65) Prior Publication Data
US 2019/0008063 A1 Jan. 3, 2019

(30) Foreign Application Priority Data
Dec. 16, 2015 (DE) .................. 10 2015 121 979

(51) Int. Cl.
*H05K 9/00* (2006.01)
*H05K 5/06* (2006.01)
(Continued)

(52) U.S. Cl.
CPC .......... *H05K 5/069* (2013.01); *C23C 28/023* (2013.01); *C25D 5/34* (2013.01); *H05K 5/0004* (2013.01);
(Continued)

(58) Field of Classification Search
CPC .......................... H05K 9/0028; H05K 9/0039
See application file for complete search history.

(56) References Cited

U.S. PATENT DOCUMENTS 5,901,050 A * 5/1999 Imai .................. H01L 23/055
257/686
6,492,194 B1 12/2002 Bureau et al.
(Continued)

FOREIGN PATENT DOCUMENTS

CN 1094883 A 11/1994
CN 101107705 A 1/2008
(Continued)

*Primary Examiner* — Hung V Ngo
(74) *Attorney, Agent, or Firm* — Slater Matsil, LLP

(57) ABSTRACT

A housing and a method for manufacturing a housing are disclosed. In an embodiment a housing for an electric component includes a first housing part and a second housing part, wherein the first housing part and the second housing part are connected in a joining region, wherein the joining region is completely or partially covered by a metallic coating on an outside, wherein the first housing part is joined to the second housing part by a connecting agent, wherein the connecting agent is an adhesive or a solder material, wherein the metallic coating covers the first housing part only at an upper side of the first housing part accessible from the outside when the housing parts are joined by the connecting agent, and wherein the metallic coating extends laterally beyond the first housing part and at least partially covers the second housing part.

19 Claims, 5 Drawing Sheets

(51) Int. Cl.
*C23C 28/02* (2006.01)
*C25D 5/34* (2006.01)
*H05K 5/00* (2006.01)
*H05K 5/02* (2006.01)

(52) U.S. Cl.
CPC ......... *H05K 5/0247* (2013.01); *H05K 9/0028* (2013.01); *H05K 9/0039* (2013.01); *H05K 9/0045* (2013.01); *H05K 9/0049* (2013.01)

(56) References Cited

U.S. PATENT DOCUMENTS

| | | | |
|---|---|---|---|
| 6,982,380 | B2 | 1/2006 | Hoffmann et al. |
| 7,552,532 | B2 | 6/2009 | Stelzl et al. |
| 8,299,859 | B2 | 10/2012 | Sato et al. |
| 8,941,017 | B2 | 1/2015 | Nagano |
| 9,089,917 | B2 | 7/2015 | Sommerfeldt et al. |
| 2001/0009277 | A1* | 7/2001 | Gaynes ............... H01L 21/563 257/1 |
| 2003/0197569 | A1 | 10/2003 | Mizusawa |
| 2014/0226285 | A1 | 8/2014 | Bauer et al. |

FOREIGN PATENT DOCUMENTS

| | | |
|---|---|---|
| CN | 102098020 A | 6/2011 |
| CN | 102185580 A | 9/2011 |
| DE | 10164494 A1 | 7/2003 |
| DE | 102011112476 A1 | 3/2013 |
| DE | 102013002628 A1 | 8/2014 |
| JP | H02244658 A | 9/1990 |
| JP | 2001176995 A | 6/2001 |
| JP | 2004135193 A | 4/2004 |
| JP | 2004537178 A | 12/2004 |
| JP | 2005079656 A | 3/2005 |
| JP | 2005184309 A | 7/2005 |
| JP | 2006303485 A | 11/2006 |
| JP | 2010225752 A | 10/2010 |
| JP | 2011147054 A | 7/2011 |
| JP | 2011184639 A | 9/2011 |
| WO | 0143517 A1 | 6/2001 |
| WO | 03012856 A2 | 2/2003 |

* cited by examiner

HOUSING USED FOR ELECTRIC COMPONENT AND METHOD FOR MANUFACTURING SAME

CROSS-REFERENCE TO RELATED APPLICATIONS

This patent application is a national phase filing under section 371 of PCT/CN2016/109474, filed Dec. 12, 2016, which claims the priority of German patent application 10 2015 121 979.4, filed Dec. 16, 2015, each of which is incorporated herein by reference in its entirety.

TECHNICAL FIELD

The present invention proposes a housing for an electric component, and a method for manufacturing a housing for an electric component.

BACKGROUND

Many electric components, in order to ensure their functions and reliability, require tight sealing. The tight sealing is realized, for example, by housing the component inside a cavity; being, for example, formed by a basin-like base plate together with a flat cover, a flat base plate together with a basin-like cap, or a basin-like base plate together with a basin-like cap.

For example, housing parts are connected to each other by bonding or soldering. Here, connection is realized by melting and re-solidification or by a thermally stimulated polymerization effect. Heating arising from a process can cause a pressure increase inside the housing and subsequent problems arising therefrom, for example, housing part sliding or floating. Another possible consequence is diffluence of a connecting agent or the formation of a channel due to cracking under internal overpressure and a lack of sealing caused by this.

SUMMARY

Embodiments provide an improved housing for an electric component, and an improved manufacturing method for the housing.

According to a first aspect of the present invention, a housing for an electric component is proposed. The housing is, for example, configured to accommodate a semiconductor chip, MEMS chip, SAW chip or BAW chip, and/or a passive component. In particular, the housing has a cavity for accommodating a component.

The housing may comprise a first housing part and a second housing part. For example, the first housing part is formed as a cap, in particular formed as an arched cap. Alternatively, the first housing part is, for example, formed as a cover, in particular a flat cover. The second housing part is, for example, formed by a base plate, in particular formed by a multi-layer base plate. The housing may have another housing part in addition to the first and second housing parts.

The first housing part and second housing part are connected in a joining region. The joining region is preferably closed in a tightly sealed manner. Preferably, the entire housing is closed in a tightly sealed manner. Here, "tight" may be understood to mean: in particular prohibiting an exchange process caused by a permeation effect. Preferably, the housing is watertight. In this regard, alternatively or additionally, the housing is airtight.

In one embodiment, the first housing part and second housing part are connected by a connecting agent. Preferably, at least rough sealing of the joining region is ensured by means of the connecting agent. For example, infiltration of particles into the cavity when a coating is applied is prevented by means of the connecting agent.

The connecting agent may be conductive. For example, a conductive adhesive or solder is used as the connecting agent. In this case, in addition to a mechanical connection, an electrical connection of the housing parts may also be established via the connecting agent. Alternatively, the connecting agent may be electrically insulating.

At least before a connection process, in particular before hardening, the connecting agent preferably may have a high viscosity. Preferably, the viscosity is at least 10000 mPas at 25° C. In particular, the connecting agent may have a viscosity of at least 25000 mPas at 25° C.

Housing part sliding or floating may be prevented by the high viscosity. In addition, discharge of connecting agent and cracking of connecting agent may be prevented when overpressure forms in the cavity.

For example, an epoxy-resin-based or acrylate-based bonding agent is used as the connecting agent. Alternatively, the connecting agent may comprise solder. Here, high viscosity may, for example, be set by embedding solder into a suitable auxiliary material.

In one embodiment, the joining region is at least partially covered by a metal coating. Preferably, the joining region is completely covered by the coating from the outside.

In this way, in particular in the case where the connecting agent itself is not completely watertight, watertight sealing of the joining region may, for example, be realized. This is generally such a situation when the bonding agent is plastic-based. When solder is used as the connecting agent, it is already possible to form a metal tight locking by means of the connecting agent, such that further sealing of the joining region is not necessarily required. Of course, the coating may be advantageous, in order to keep the housing parts sealed and firm in a subsequent step, for example, when a member is soldered into the vicinity of a circuit, when the solder melts again.

In one embodiment, the coating has at least one layer applied by electroplating. As a material for the layer, Cu or Ni is, for example, suitable.

In an electroplating application method, a high overall layer thickness may be manufactured more economically than by means of a pure sputtering method.

For example, the coating has at least two layers. When a first layer also has residual pores, a second layer is particularly advantageous. Thus, the second layer can ensure tight sealing of the joining region. If the connecting agent is not conductive, then the first layer may in particular be needed.

The first layer is, for example, manufactured by spraying particles. In particular, the first layer may be deposited in a sputtering method. The first layer may act as a starting layer ("seed-layer") for application of the second layer, for example, an electroplated layer. Reinforcement of the first layer can then be performed by means of the electroplated layer.

In one embodiment, an entire top side of the first housing part is provided with the coating. For example, good sealing of the housing can thereby be ensured, in particular when the first housing part itself is not watertight and/or airtight. In this regard, alternatively or additionally, shielding may be performed by means of a full-surface-applied coating.

In one embodiment, the first housing part is formed by an electrically insulating material. For example, the first housing part contains a polymer material or is formed by a polymer material. It is advantageous in this case that the entire top side of the first housing part is provided with the coating.

In one embodiment, the housing has an electric contact part. The electric contact part is, for example, configured to be used for contact with the coating. The contact part may in particular be formed as a grounding connection. Shielding of the housing can be realized in this way.

In one embodiment, the coating is electrically connected directly with the electric contact part. For example, the contact part protrudes past a plane profile of the first housing part. In particular, the contact part protrudes from the joining region.

In one embodiment, the coating is only indirectly connected electrically to the electric contact part. For example, the connecting agent, for example, conductive adhesive or solder, is applied to the contact part. The coating may be in direct electrical contact with the connecting agent, so as to produce an indirect electrical connection with the electric contact part.

In one embodiment, the contact part is disposed on an outer side of the second housing part. In one embodiment, the contact part is disposed inside the second housing part, for example, in the housing part formed as a multi-layer base plate. The contact part is, for example, formed in a lamellar manner.

For example, the second housing part has a recess. The coating, for example, extends into the recess and is connected to the electric contact part there. Such contact has the advantage that a contact region between the coating and the electric contact part can be kept uncontaminated by the connecting agent. For example, first of all the connecting agent is applied and hardened and then the recess is introduced, so as to expose the contact part. The coating can then be applied.

In one embodiment, the electric contact part and/or coating extend(s) to a side edge of the second housing part. This has the advantage that the contact part and/or coating can be produced especially economically when manufacturing is carried out. For example, the housing is manufactured by separating a housing arrangement on the basis of multiple uses.

According to another aspect of the present invention, a housing arrangement is proposed. The housing arrangement has at least one housing as described above and at least one other housing part. For example, the first housing part and the second housing part form the housing, and the other housing part and the second housing part form another housing. The first housing part and the other housing part may have the same geometric structure, for example, be formed as caps.

For example, the housing arrangement has two cavities, separated from each other, to accommodate electric components. For example, the second housing part is formed as a base plate, and multiple device regions are provided on the base plate. Each device region may have one or more electric components and may be sealed by means of the first housing part or the other housing part. For example, the devices are processed together via multiple manufacturing steps on a common base plate and then separated.

In particular, the housing arrangement may have multiple joining regions between different housing components. In particular, a joining region may be present between the first and second housing parts, and another joining region may be present between the other housing part and the second housing part.

The joining region may be provided with a coating as described above. Preferably, a common coating for the first housing part and another housing part is formed. Here, sputtering and electroplating are confirmed to be very economical as surface processes.

In one embodiment, the housing arrangement has at least one electric contact part; the electric contact part, as described above, is for example, configured to contact the first housing part and/or the other housing part. A common electric contact part for the first housing part and the other housing part may also be formed. When the housings are separated, the common electric contact part is separated while maintaining its function.

According to another aspect of the present invention, a device comprising the housing as described above is proposed. The device has at least one electric component disposed in the housing. For example, the electric component is formed as a semiconductor chip, SAW chip, BAW chip or MEM chip and/or a passive component.

In addition, a device arrangement having multiple electric components is proposed. In the device arrangement, multiple electric components are accommodated in the housing arrangement described above.

According to another aspect of the present invention, a method for manufacturing a housing, housing arrangement and/or device is proposed. The housing, housing arrangement and/or device is/are preferably formed as described above. In the method, first and second housing parts are connected to each other in a joining region. For example, the housing parts are connected by a connecting agent. In particular, the connecting agent may have a high viscosity.

In one embodiment, the connecting agent hardens at a temperature less than 150° C. In this way, a pressure increase in a cavity should be kept as small as possible when the connecting agent is hardened. In addition, diffluence of the connecting agent should be avoided.

In one embodiment, at least one of the housing parts is loaded with the force of gravity or an elastic force during hardening of the connecting agent. In this way, it is likewise possible to prevent sliding of the housing parts and/or the formation of holes caused by leaking overpressure.

In one embodiment, multiple housings or devices are manufactured together in this way. For example, the housing arrangement is manufactured by the method, wherein, in addition to the first and second housing parts, at least one other housing part is present. The housing arrangement can then be separated. Preferably, a common coating is applied to multiple housing parts which are to be subsequently separated.

In one embodiment, an electric contact part is formed and an electrical connection with the coating is established. For example, the electric contact part is separated when the housing arrangement is separated.

For example, the electric contact part is disposed inside the second housing part. In particular, the electric contact part may be formed as a layer or sub-layer in a multi-layer base plate. The electric contact part is, for example, exposed after hardening of the connecting agent. Then, for example, the coating is applied, such that an electrical connection between the coating and the electric contact part is established.

Multiple aspects of the present invention are described in this disclosed document. All characteristics disclosed in conjunction with the housing, housing arrangement, device, device arrangement or method are also correspondingly disclosed in conjunction with various other aspects and vice versa, even if corresponding characteristics are not mentioned in detail in paragraphs of corresponding aspects.

BRIEF DESCRIPTION OF THE DRAWINGS

The subject described here is expounded in detail below according to schematic embodiments.

The accompanying drawings show the following.

Preferably, in the accompanying drawings below, identical reference labels represent functionally or structurally corresponding components of different embodiments.

DETAILED DESCRIPTION OF ILLUSTRATIVE EMBODIMENTS

Figure 1:
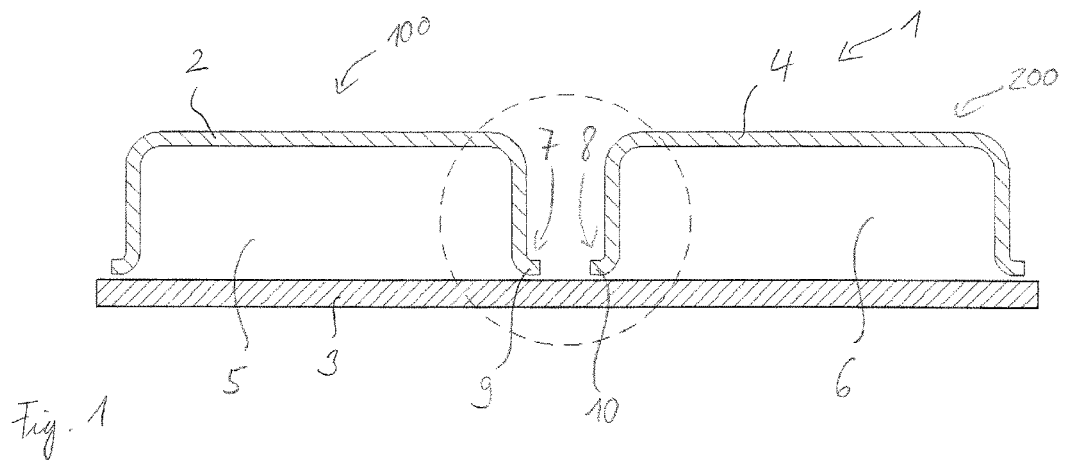
FIG. 1 shows a schematic cross section of a housing arrangement.

FIG. 1 shows a housing arrangement 1 having two housings 100, 200 for electric components. For example, the housings 100, 200 are configured to accommodate semiconductor chips, SAW chips, BAW chips, MEMS chips and/or passive components. Other details, such as internal wiring and external interfaces, are not shown here.

The housing 100 and the other housing 200 are preferably processed together by multiple manufacturing steps and then separated. The housing arrangement 1 may have multiple other housing parts. When a lateral device dimension is about 1 mm to 5 mm, applications of such a base plate, for example, may include several hundred to over 10000 devices.

The housing 100 consists of a first housing part 2 and a second housing part 3; the other housing 200 consists of another housing part 4 and the second housing part 3. The first housing 100 encloses a cavity 5 and the other housing 200 encloses another cavity 6. The cavities 5, 6 are formed separately from each other. At least one component (not shown) is preferably accommodated in each cavity 5, 6.

The first housing part 2 and the other housing part 4 are formed as caps. The second housing part 3 is formed of a base plate. In particular, it may be a multi-layer base plate. Alternatively, the first housing part and the other housing part could also be formed as flat covers, covering recesses in the second housing part.

For example, the first housing part 2 and/or the other housing part 4 may comprise a metal. Good electromagnetic shielding can thereby be realized. Alternatively, the housing parts 2, 4, for example, may have a non-conductive material. In particular, a plastic material may be used. For example, the housing parts 2, 4 have a polymer material. A ceramic material could also be used.

The materials of the first housing part 2 and the other housing part 4 need not necessarily be beneficial for electromagnetic shielding or tightness of a manufactured apparatus, and so need only ensure appropriate processability and strength. If necessary, tightness and electric shielding may be ensured in another respect.

Preferably, the second housing part 3 is formed such that a diffusion blocking layer is also provided by a device bottom side. The second housing part 3, for example, has a ceramic material. The ceramic is, for example, formed as HTCC ceramic (high-temperature co-fired ceramic) or LTCC ceramic (low-temperature co-fired ceramic). Shielding which might be required may be realized here, for example, by means of an external or internal metal layer.

The housing parts 2, 4 have base regions 9, 10, and the housing parts 2, 4 are mounted onto the second housing part 3 by means of joining regions. The base regions 9, 10 have an outwardly curved shape. For example, the base regions 9, 10 have an annular or rectangular geometric shape in a top view.

The first housing part 2 and the second housing part 3 are connected in a joining region 7. Another joining region 8 is formed between the other housing part 4 and the second housing part 3. The joining regions 7, 8 enclose the first housing part 2 and the other housing part 4. The joining regions 7, 8 are in particular formed on the base regions 9, 10.

The joining regions 7, 8 are preferably formed such that the cavities 5, 6 are closed to the outside in a sealed manner, in particular in a watertight manner.

Different embodiments of the joining regions 7, 8 are described in detail below. Those parts of the housings 100, 200 which are located in the dotted-line circle are correspondingly shown in magnified form. Embodiments of the housing arrangement 1 having two joining regions 7, 8 are shown, but these are correspondingly also applicable to a single housing having a joining region.

Figure 2:
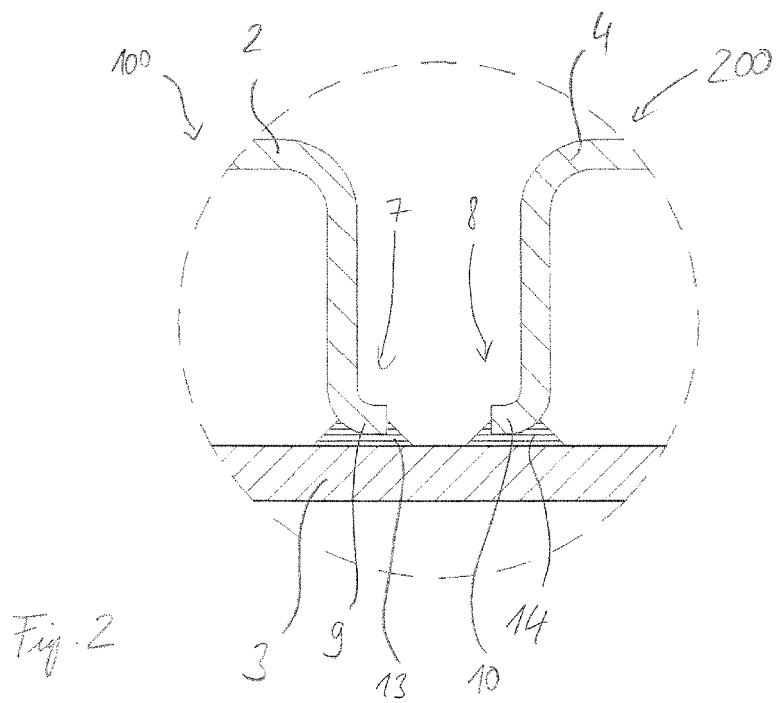
FIGS. 2 to 4 show schematic cross sections of embodiments of joining regions.

FIG. 2 shows a schematic cross section of an embodiment of the joining regions 7, 8 of the housings 100, 200.

The housing parts 2, 4 are connected to the second housing part 3 by means of connecting agents 13, 14 respectively. The connecting agents 13, 14 are preferably formed annularly and continuously. In particular, the connecting agents 13, 14 are continuously present along the base regions 9, 10 respectively.

The connecting agents 13, 14 may be conductive. For example, a bonding agent, in particular a conductive adhesive, may be used as the connecting agents 13, 14. Alternatively, the connecting agents 13, 14 may also comprise solder. The connecting agents 13, 14 may also be electrically insulating.

Before solidification, the connecting agents 13, 14 preferably have high viscosity. Preferably, the viscosity is at least 10000 mPas at 25° C. In particular, the connecting agents 13, 14 may have a viscosity of at least 25000 mPas at 25° C. For example, the connecting agents 13, 14 are epoxy-resin-based or acrylate-based.

The connecting agents 13, 14 preferably harden at a temperature less than or equal to 150° C. Preferably, the temperature is at most 100° C. or at most 80° C. When hardening takes place, the temperature is, for example, lower than 100° C. or 80° C. at least in a first stage. After a first hardening of the connecting agents 13, 14, the temperature may also be increased above the value. In specific connecting agents 13, 14, for example, in dual-component bonding agents, hardening may also be realized at room temperature.

In this regard, additionally or alternatively, the housing parts 2, 4 may be loaded with gravity weight force or an elastic force during hardening of the connecting agents 13, 14. The weight force or the elastic force, for example, lies within the range of 1 cN to 20 cN per $mm^2$ cap plane. Based on the volume and base area of the housing parts 2, 4, one or two of the measures may also already achieve an objective, in order to prevent the housing parts from sliding and/or hole formation in the connecting agent.

The connecting agents 13, 14 preferably cause rough, seamless sealing of the joining regions 7, 8. Indeed, the connecting agents 13, 14 may be penetrable by steam. Thus, tight sealing of the joining regions 7, 8 may be realized by means of another coating, in particular a metal coating.

Figure 3:
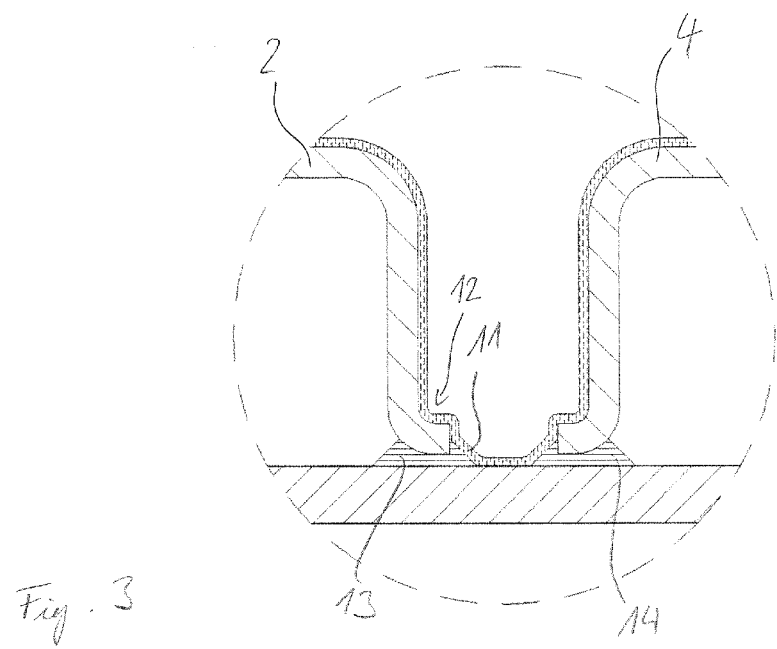

FIG. 3 shows a schematic cross section of an embodiment in which the joining regions 7, 8 are provided with a first layer 11 of a coating 12.

In particular, the connecting agents 13, 14 are completely covered by the coating 12 from the outside. The coating 12 also covers the base regions 7, 8 from the outside. The coating 12 may cover the entire outer surfaces of the housing parts 2, 4. In addition, the coating 12 also partially covers the second housing part 3 between the first housing part 2 and the other housing part 4.

The first layer 11 covers the two joining regions 7, 8 and is continuously applied. This is especially advantageous when the distance between the devices disposed in the cavities 5, 6, or the distance between the first housing part 2 and the other housing part 4, is small. For example, the distance lies within a range of local resolution of a coating method, or is lower than the range. Alternatively, the coating 12 may be interrupted between the housing parts 2, 4.

The first layer 11 is, for example, applied by a coating method, wherein particles are directionally sprayed onto the disposed housing parts 2, 3, 4 from the outside. Thus, a greater or smaller number of particles bonded together may also be seen in the first layer 11. The first layer 11, based on a spraying method, is only applied to top sides of the housing parts 2, 3, 4 and of the connecting agents 13, 14. The coating 12 is only located in regions which can be approached from the outside when spraying is performed. In particular, there is no coating 12 located in the cavities 5, 6.

The first layer 11 is, for example, a PVD layer or a CVD layer, in particular a sputtered layer. The first layer preferably has a small thickness. For example, the thickness is in the range of 0.1 μm to 10 μm. The first layer 11 is preferably firmly adhered to the housing parts 2, 3, 4. The first layer 11, for example, comprises Ti, Cr, W, Cu, Ni, Al or a combination of these materials as a mixture or a sub-layer. In particular, the first layer 11 may be conductive.

Tight sealing of the cavities 5, 6 should be ensured, for example, by means of the metal coating 12. In particular, infiltration of steam should be prevented. Based on the sealing of the cavities 5, 6 by means of the connecting agents 13, 14 that has already been carried out roughly, a vacuum or wet process may also be used when the coating is applied.

Figure 4:
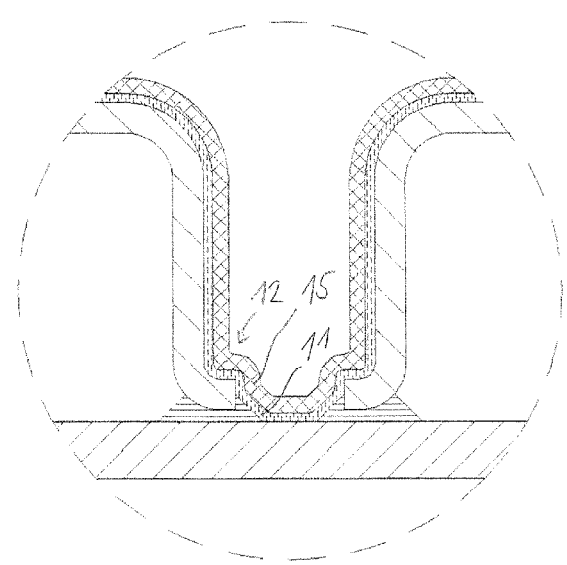

FIG. 4 shows a schematic cross section of an embodiment in which the coating has a second layer 15 attached to the first layer 11 in FIG. 3. The second layer 15 coats the first layer 11.

The first layer 11, for example, acts as a starting layer ("seed-layer") for application of the second layer 15. For example, the second layer 15 is applied by electroplating. For example, the second layer 15 has Cu or Ni. The second layer 15, for example, has a thickness in the range of 10 μm-200 μm. The second layer 15 may also be formed by immersing in a metal solution with a low melting point, in particular tin or a tin alloy.

The second layer 15 completely covers the two housing parts 2, 4. For example, the materials of the first housing part 2 and the other housing part 4 lack sufficient sealing to tightly seal the cavities 5, 6. Sufficient sealing can be realized by full-surface use of the coating 12 for coverage. In this regard, alternatively or additionally, electric shielding can be manufactured by means of the full-surface coating 12.

In this regard, alternatively, the coating 12 also only covers the joining regions 7, 8. In this case, the housing parts 2, 4 preferably have a tightly sealing material.

FIGS. 2 to 4 can show different embodiments of the joining regions of the housing arrangement. Alternatively, FIGS. 2 to 4 can also show method steps, which follow each other, when the joining regions of the housing arrangement according to FIG. 4 are manufactured.

Figure 5:
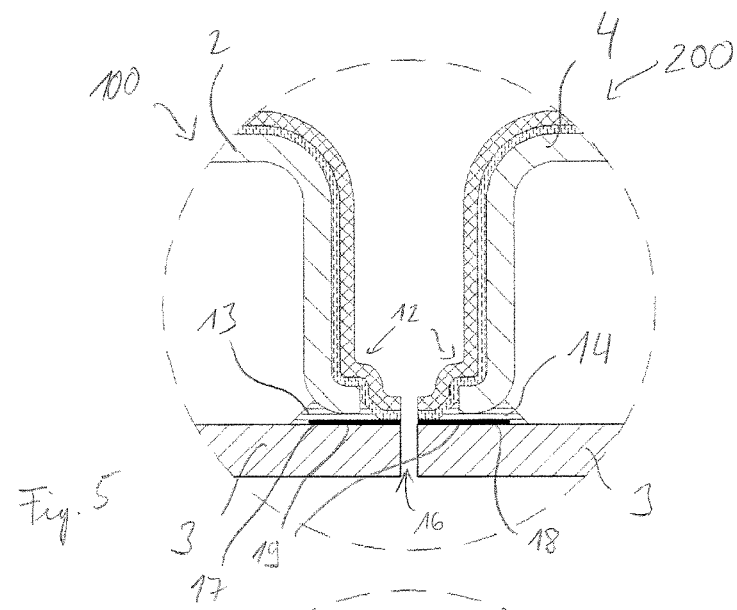
FIGS. 5 to 7 show schematic cross sections of embodiments of joining regions having electric contact parts.

FIG. 5 shows a schematic cross section of another embodiment of the joining regions 7, 8 after separation of the housings 100, 200.

In particular, the housing arrangement is separated by means of a cut 16 inserted between the first housing part 2 and the other housing part 4. For example, separation is carried out by sawing, by grinding, by scraping and breaking or by laser cutting. The cut 16 separates the second housing part 3 and the coating 12. Based on the shown separation of the housing arrangement, the coating 12 extends to an edge of the second housing part 3 in each housing 100, 200.

The joining regions 7, 8 are substantially formed as described in FIG. 4. Of course, an electric contact part 19 is disposed on the second housing part 3; the electric contact part is split into two electric contact parts 17, 18 by the cut 16. Thus, the adjacent housings 100, 200 share the contact part 19 before separation. Due to this manner of formation of the contact part 19, the electric contact parts 17, 18 each extend to an edge of the second housing part 3. The electric contact part 19 is, for example, applied to a surface of the second housing part 3 as a metallized part.

Preferably, the electric contact parts 17, 18 are used for electric contact of the coating 12. In particular, the electric contact parts 17, 18 are formed as grounding electrodes. This, for example, may be used for electromagnetic shielding. The contact parts 17, 18 may be internally joined and connected (not shown here).

The electric contact parts 17, 18 are directly connected to the coating 12, in particular the first layer 11 of the coating 12. The contact part 17 or 18 protrudes past a plane profile of the first housing part 2 or the other housing part 4 in a top view. The electric contact parts 17, 18 are not completely covered by the connecting agents 13, 14. Exposure of the contact parts 17, 18 may be carried out by coating with the connecting agents 13, 14 correspondingly in a structured manner. Alternatively, exposure may be realized by at least partially exposing the electric contact parts 17, 18 from the connecting agents 13, 14 with which they are coated. For example, the contact parts 17, 18 are exposed by sawing or laser stripping.

In addition, the contact parts 17, 18 also reach a region below the base regions 9, 10 of the housing parts 2, 4. Alternatively, the contact parts 17, 18 may also only be disposed between the housing parts 2, 4.

When the coating 12 is applied, the electric contact part 19 is at least partially covered with the coating 12. In this way a conductive connection between the coating 12 and the contact part 19 can be established.

In the case where the housing parts 2, 4 are conductive, a conductive connection between the contact part 19 and the housing parts 2, 4 can also be thereby established. In particular, when there is no direct electric contact between the housing parts 2, 4 and the contact parts 17, 18, or when the connecting agents 13, 14 are electrically insulating, a conductive connection is also established.

In the case where the connecting agents 13, 14 are conductive, the coating 12 alternatively is also only indirectly connected to the contact parts 17, 18 via the connecting agents 13, 14, such that there is no need for direct contact between the coating 12 and the contact parts 17, 18.

Figure 6:
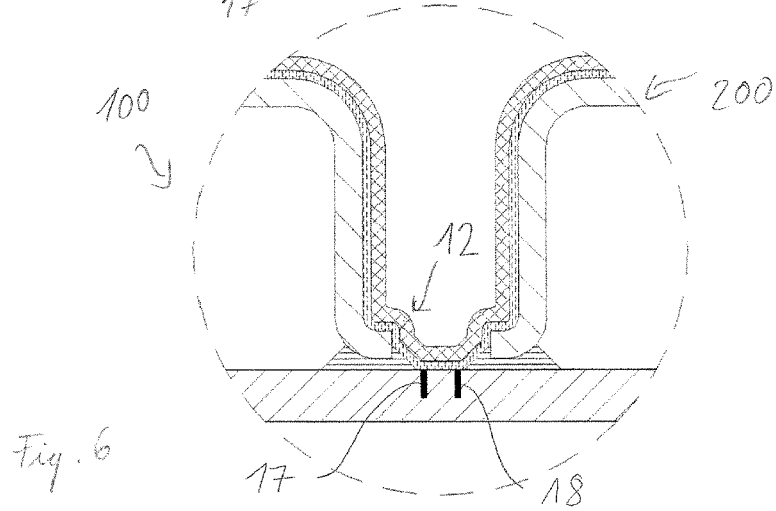

FIG. 6 shows a schematic cross section of another embodiment of the joining regions 7, 8. The joining regions 7, 8 are substantially formed as described in FIG. 5. However, the electric contact parts 17, 18 are not formed as surface structural elements here but are instead formed as holes, i.e., formed as through-hole contact parts.

For example, the electric contact parts 17, 18 are formed by holes having a metal filling part or wall lining. For this purpose, another internal connection (not shown) is also provided. The electric contact parts 17, 18 are directly connected to the coating 12.

Figure 7:
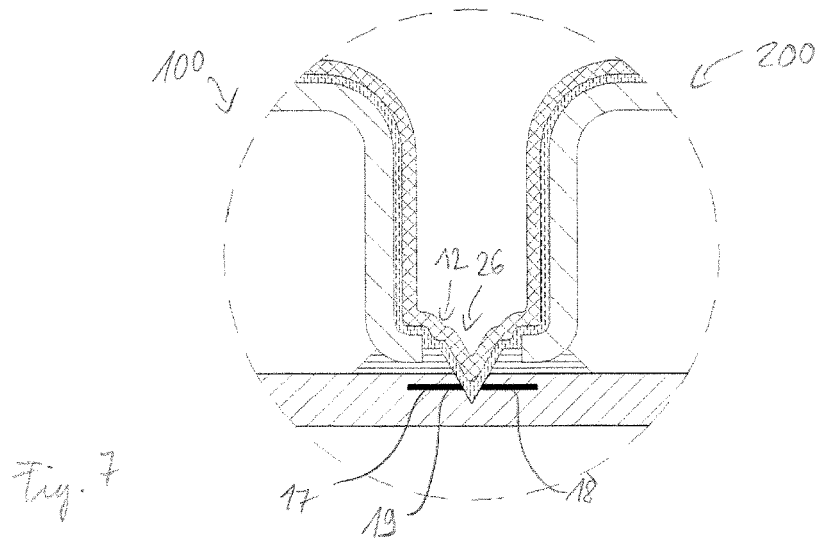

FIG. 7 shows another embodiment of the joining regions 7, 8, wherein the coating 12 is connected to the electric contact parts 17, 18. The electric contact parts are located inside the second housing 3 and, for example, formed as an internal metal structure in a multi-layer base plate.

In order to form the contact parts 17, 18, the housing part 2 first of all has a continuous electric contact part 19 inside, the electric contact part, for example, being formed as a metal layer. Then, the contact part 19 is at least partially exposed. This, for example, may be realized by means of a V-shaped or rounded saw cut in the housing part 3. A recess 26 is thereby formed in the second housing part 3. The contact part 19 is exposed in the recess 26. By exposing the contact part 19, separation into two single contact parts 17, 18 can be realized. However, the contact parts 17, 18 need not be separated compulsorily via exposure.

Preferably, exposure of the contact part 19 is carried out after the housing parts 2, 4 have been fixed to the second housing part 3, in particular after hardening of the connecting agents 13, 14. This has the advantage that a contact region is not contaminated by possible outflow of connecting agent.

Next, the coating 12 is deposited. The coating 12 extends into the recess of the second housing part 3 and then is electrically connected directly to the electric contact parts 17, 18. In particular, the first layer 11 is electrically connected directly to the contact parts 17, 18. The contact parts 17, 18 are also connected here to a desired electric potential by means of a connection formed by a strip-like conductive wire and/or through-hole contact part.

Figure 8:
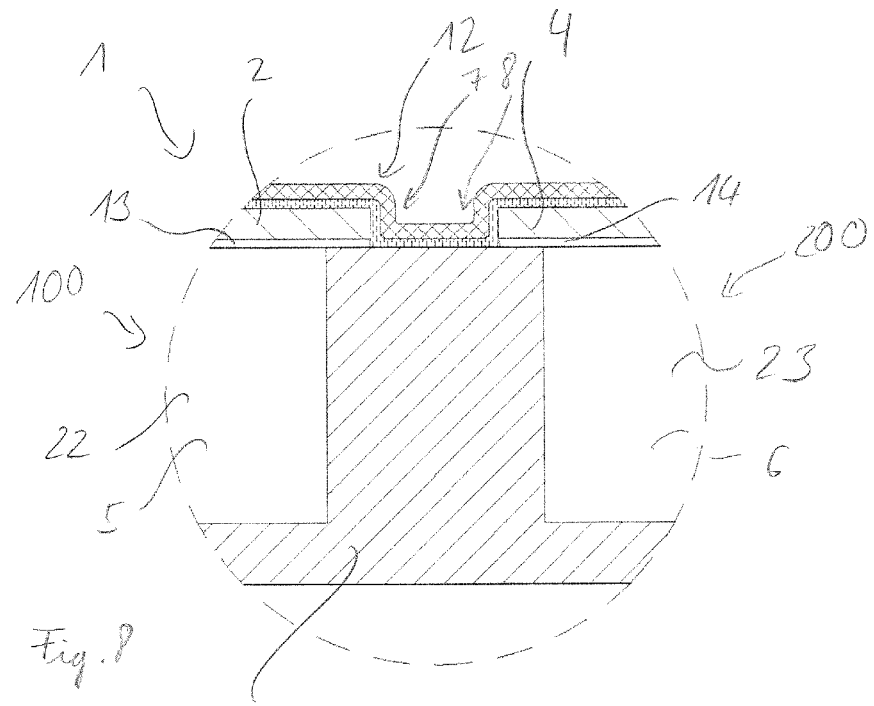
FIGS. 8 and 9 show schematic cross sections of embodiments of joining regions.

FIG. 8 shows another embodiment of a housing arrangement 1 having two housings 100, 200.

Unlike the previous embodiments, the first housing part 2 and the other housing part 4 are formed as flat covers. The second housing part 3 has recesses 22, 23 to accommodate electric components. The second housing part 3 is formed of a base plate, in particular a basin-like base plate. Thus, in the embodiment, cavities 5, 6 are not formed by means of cap-like housing parts, but are instead each formed in the base plate.

The first housing part 2 and the other housing part 4 are provided with a common coating 12 which seals joining regions 7, 8. In addition, the coating 12 completely covers top sides of the housing parts 2, 4.

In the housing design, the housing parts 2, 4 are also fixed to the second housing part 3 by means of connecting agents 13, 14. The connecting agents 13, 14 are, for example, formed as a full-surface layer of the housing parts 2, 4. Alternatively, the connecting agents 13, 14 may also be present only in edge regions of the housing parts 2, 4.

The embodiment may also have all variants of the joining regions and coatings as described in the previous accompanying drawings. The coating 12 in particular may be electrically contacted.

Figure 9:
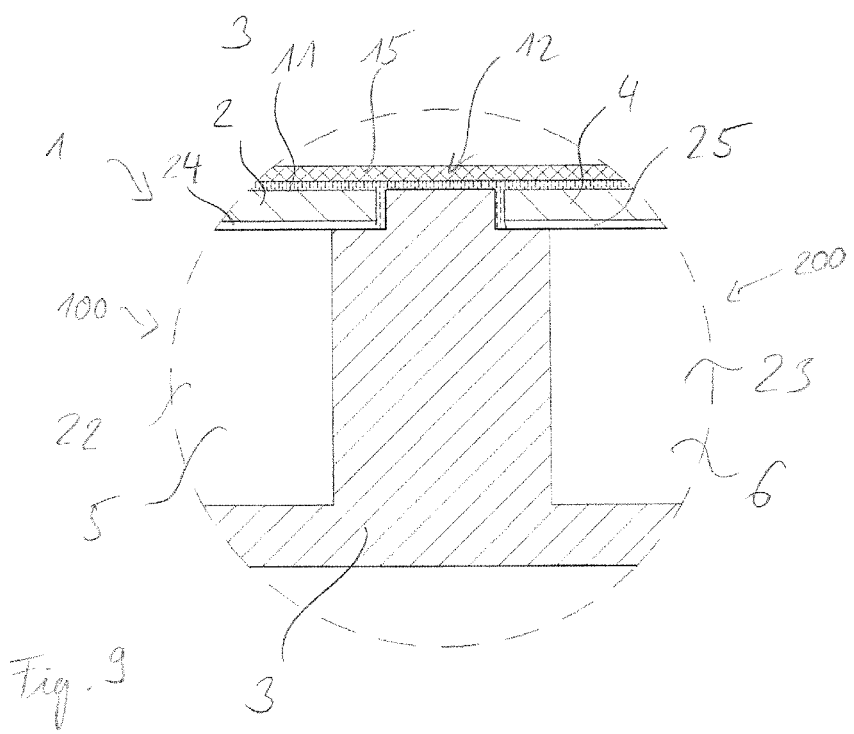

FIG. 9 shows another embodiment of the housing arrangement 1 having two housings 100, 200, wherein the first housing part 2 and the other housing part 4 are each formed as flat covers as in the embodiment according to FIG. 8.

The second housing part 3 is formed like a basin and, in addition to recesses 22, 23 for accommodating electric components, has additional recesses 24, 25; the first housing part 2 and the other housing part 4 are installed in the additional recesses. The recesses 24, 25 form shoulders, which are beneficial for position reinforcement of the housing parts 2, 4.

A first layer 11 of a coating 12 partially extends into the additional recesses 24, 25. A second layer 15 is, for example, formed so as to be flat.

Figure 10:
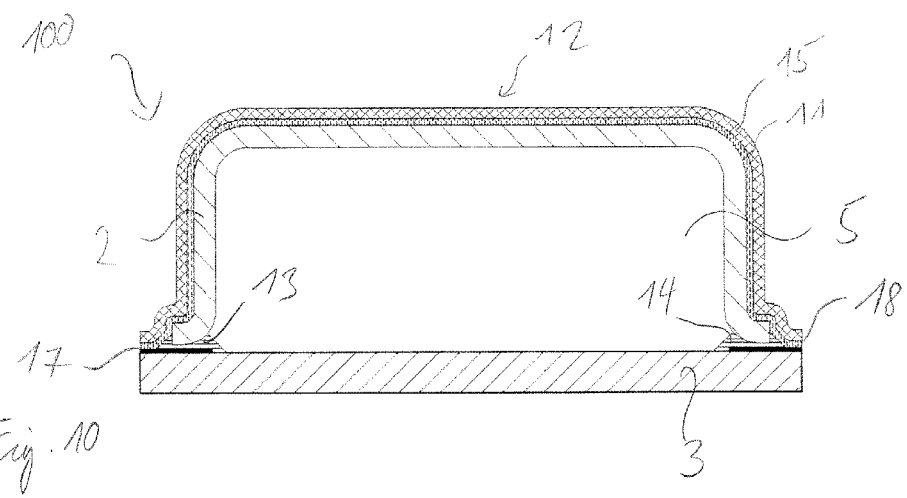
FIGS. 10 and 11 show embodiments of housings.

FIG. 10 shows a separated housing 100. For example, an electric component (not shown here) is disposed in the cavity 5. In particular, the whole of the housing 100 shown in FIG. 5 can be seen.

The joining region 7 is completely covered by the coating 12, so as to ensure tight sealing of the cavity 5.

The housing part 2 is completely covered by the coating 12 from the outside. The coating 12 is connected to the electric contact pails 17, 18, so as to ensure electric shielding. The coating 15 extends to edges of the second housing part 3. The contact pails 17, 18 likewise extend to edges of the second contact element 3.

Figure 11:
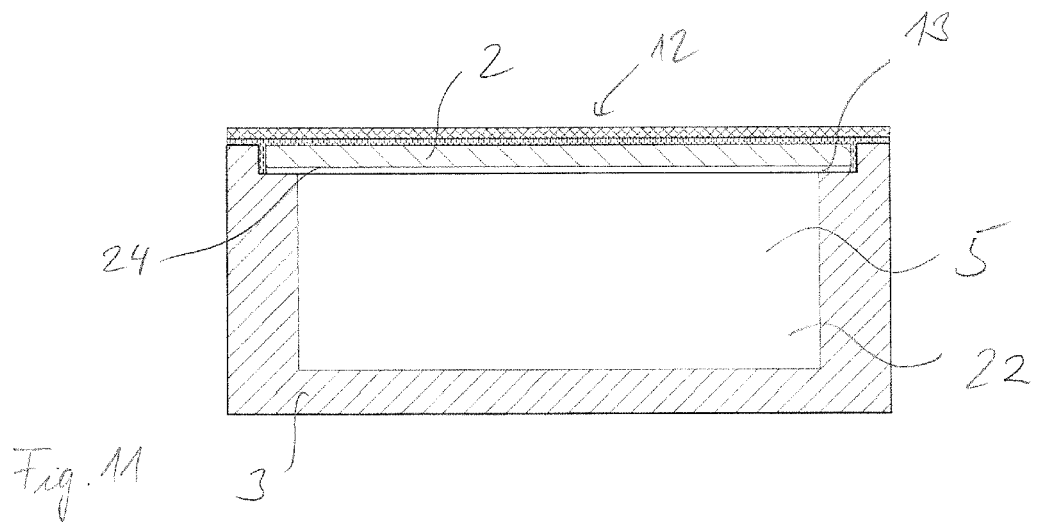

FIG. 11 shows a separated housing 100 of the housing arrangement 1 in FIG. 9. In particular, the first housing part 2 is formed as a flat cover, which is installed in the recess 24 of the second housing part 3. The second housing part 3 also has the recess 22 for accommodating a component.

Here, the coating 12 may also be connected to an electric contact part, for example, similar to the contact parts 17, 18 in FIG. 10.

The invention claimed is:

1. A housing for an electric component comprising:
a first housing part; and
a second housing part, wherein the first housing part and the second housing part are connected in a joining region, wherein the joining region is completely or partially covered by a metallic coating on an outside,
wherein the first housing part is joined to the second housing part by a connecting agent, wherein the connecting agent is an adhesive material or a solder material,
wherein the metallic coating covers the first housing part only at an upper side of the first housing part accessible from the outside when the first and second housing parts are joined by the connecting agent,
wherein the metallic coating extends laterally beyond the first housing part and at least partially covers the second housing part,
wherein the second housing part comprises a recess, and wherein the metallic coating extends into the recess and is connected to an electric contact part in the recess.

2. The housing as claimed in claim 1, wherein the connecting agent has a viscosity greater than 10000mPas before solidification.

3. The housing as claimed in claim 1, wherein the first and second housing parts comprise a plastic material or a ceramic material.

4. The housing as claimed in claim 1, wherein the metallic coating comprises at least two layers, and wherein at least one of the layers is applied by electroplating.

5. The housing as claimed in claim 1, further comprising at least one electric contact part, wherein the metallic coating and the electric contact part are conductively connected.

6. The housing as claimed in claim 5, wherein the electric contact part extends to a side edge of the second housing part.

7. The housing as claimed in claim 1, wherein the electric contact part is disposed inside the second housing part.

8. The housing as claimed in claim 1, wherein at least one of the first and second housing parts has a shoulder for position reinforcement of the at least one of the first and second housing parts.

9. A housing arrangement comprising:
at least one housing as claimed in claim 1; and
at least one third housing part.

10. A device comprising:
at least one housing as claimed in claim 1; and
at least one electric component accommodated in the housing.

11. The housing as claimed in claim 1, wherein the connecting agent is an epoxy-resin-based or acrylate-based bonding agent.

12. A method for manufacturing a housing, wherein the housing comprises a first housing part and a second housing part, wherein the first housing part and the second housing part are connected in a joining region, wherein the joining region is completely or partially covered by a metallic coating on an outside, wherein the first housing part is joined to the second housing part by a connecting agent, wherein the connecting agent is an adhesive material or a solder material, wherein the metallic coating covers the first housing part only at an upper side of the first housing part accessible from the outside when the first and second housing parts are joined by the connecting agent, and wherein the metallic coating extends laterally beyond the first housing part and at least partially covers the second housing part, the method comprising:
joining the first housing part to the second housing part by the connecting agent;
after joining the first housing part to the second housing part, applying the metallic coating on the first housing part so that the metallic coating at least partially covers the second housing part;
joining a third housing part with the second housing part so as to form a housing arrangement; and
separating the housing arrangement after the first to third housing parts are connected.

13. The method as claimed in claim 12, further comprising before connecting the first and second housing parts, disposing a component on one of the first housing part or the second housing part so that the component is disposed in a cavity formed by the first and second housing parts.

14. The method as claimed in claim 12, wherein the connecting agent hardens at a temperature of less than 150° C.

15. The method as claimed in claim 12, further comprising performing a loading with weight force and/or an elastic force while connecting the first and second housing parts.

16. The method as claimed in claim 12, wherein, after the first and second housing parts are connected, at least one of the first housing part or the second housing part is connected to an electric contact part.

17. The method as claimed in claim 12, further comprising:
establishing an electrical connection between an electric contact part and the metallic coating; and
splitting the electric contact part into two contact parts while separating the housing arrangement.

18. The method as claimed in claim 12, wherein an electric contact part is disposed inside the second housing part.

19. The method as claimed in claim 18, further comprising:
exposing the electric contact part after hardening the connecting agent; and
applying the metallic coating so that an electrical connection between the metallic coating and the electric contact part is established.

* * * * *